(12) United States Patent
Montrone et al.

(10) Patent No.: US 11,853,048 B2
(45) Date of Patent: Dec. 26, 2023

(54) CONTROL METHOD AND DEVICE THAT RESOLVES CLOSED LOOPS IN AUTOMATIC FAULT TREE ANALYSIS OF A MULTI-COMPONENT SYSTEM

(71) Applicant: Siemens Aktiengesellschaft, Munich (DE)

(72) Inventors: Francesco Montrone, Riemerling (DE); Kai Höfig, Rohrdorf (DE); Marc Zeller, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 265 days.

(21) Appl. No.: 15/734,332

(22) PCT Filed: May 9, 2019

(86) PCT No.: PCT/EP2019/061917
§ 371 (c)(1),
(2) Date: Dec. 2, 2020

(87) PCT Pub. No.: WO2019/233700
PCT Pub. Date: Dec. 12, 2019

(65) Prior Publication Data
US 2021/0223766 A1 Jul. 22, 2021

(30) Foreign Application Priority Data
Jun. 7, 2018 (EP) .................................. 18176423

(51) Int. Cl.
*G05B 23/02* (2006.01)
(52) U.S. Cl.
CPC ..... *G05B 23/0248* (2013.01); *G05B 23/0275* (2013.01); *G05B 2219/24085* (2013.01)

(58) Field of Classification Search
None
See application file for complete search history.

(56) References Cited

U.S. PATENT DOCUMENTS

| 9,966,837 | B1 * | 5/2018 | Seaton | H02M 1/32 |
| 2002/0166082 | A1 * | 11/2002 | Ramadei | G05B 23/0248 714/37 |

(Continued)

OTHER PUBLICATIONS

Kabir 'An overview of fault tree analysis and its application in model based dependability analysis' Expert Systems With Applications 77 (published 2017) 114-135.*

(Continued)

*Primary Examiner* — Bernard G Lindsay
(74) *Attorney, Agent, or Firm* — Schmeiser, Olsen & Watts LLP (57) ABSTRACT

A computer-implemented method and device for resolving closed loops in automatic fault tree analysis of a multi-component system is provided. Also provided is a method for resolving closed loops in automatic fault tree analysis of a multi-component system, the closed loops corresponding, for example, to closed-loop control circuitry of a multi-component device. The closed loops are first identified in a top-down approach within failure propagation paths. Next, the loops are resolved by setting each loop interconnection to Boolean TRUE, adjusting the fault tree in a specific way and finally setting each loop interconnection to Boolean FALSE. Embodiments of the invention are relevant for analyzing safety-critical systems. However, the present concepts are not limited to these applications and may be applied to general use cases where fault tree analysis is applicable. The proposed solution advantageously provides a method that features linear complexity.

3 Claims, 4 Drawing Sheets

(56) References Cited

U.S. PATENT DOCUMENTS

| | | | | |
|---|---|---|---|---|
| 2004/0011325 | A1* | 1/2004 | Benson | F02D 41/2496 123/299 |
| 2004/0134268 | A1* | 7/2004 | Tuken | F02D 41/40 73/114.39 |
| 2009/0083576 | A1* | 3/2009 | Vlassova | G06F 30/20 714/26 |
| 2010/0193045 | A1* | 8/2010 | Xu | F17C 13/025 137/255 |
| 2015/0067400 | A1 | 3/2015 | Ishii | |
| 2015/0088476 | A1* | 3/2015 | Guo | G06F 30/20 703/6 |
| 2016/0327607 | A1* | 11/2016 | Papadopoulos | G01R 31/3177 |
| 2017/0132054 | A1* | 5/2017 | Höfig | G05B 23/0248 |
| 2017/0185470 | A1* | 6/2017 | Höfig | G06F 11/2257 |
| 2018/0018209 | A1* | 1/2018 | Höfig | G06F 11/0775 |
| 2020/0373870 | A1* | 11/2020 | Ramesh Chandran | H02P 27/06 |

OTHER PUBLICATIONS

IEC 60812 "Analysis Techniques for System Reliability—Procedure for Failure Mode and Effects Analysis (FMEA)", 1991.

IEC 61508 Standard "Functional safety of electrical/electronic/programmable safety related systems".

Vesely We et al.: "Fault Tree Handbook" US Nuclear Regulatory Commission (1981), NUREG-0492, Jan. 1981; 1981.

Ho-Gon Lim and Sang-Hoon Han. Systematic treatment of circular logics in a fault tree analysis. Nuclear Engineering and Design, 245 (Supplement C):172-179, 2012; 2012.

Vaurio et al., "A Recursive Method for Breaking Complex Logic Loops in Boolean System Models," Reliability Engineering & System Safety, 92(10):1473-1475, 2007; 2007.

Vaurio et al.: "A Recursive Method for Breaking Complex Logic Loops in Boolean System Models", Reliability Engineering & System Safety, vol. 92, No. 10, 2007, pp. 1473-1475, XP022119094, DOI: 10.1016/j.ress.2006.09.020; abstract.

Kai Höfig, Joe Zhensheng Guo, and Amir Kazeminia. Streamlining architectures for integrated safety analysis us-ing design structure matrices (dsms). Safety and Reliability: Methodology and Applications, 2014; 2014.

Philippe Cuenot, Loic Quran, Andreas Baumgart, Markus Oertel, Tilman Ochs, Christopher Ainhauser, and Lukas Bulwahn. Deliverable D331 a2: Proposal for extension of meta-model for error failure and propagation analysis. Safe Automotive software architecture (SAFE), an ITEA2 project., 2013; 2013.

Joon-Eon Yang, Sang-Hoo Han, Jin-Hee Park, and Young-Ho An. Analytic method to break logical loops automatically in psa. Reliability Engineering & System Safety, 56(2):101-105, 1997; 1997.

Kaiser et al., "A new component concept for FTs," Proceed-ings of the 8th Australian Workshop on Safety Critical Systems and Software, vol. 33, pp. 37-46, 2003.

PCT International Search Report and Written Opinion of International Searching Authority dated Jul. 11, 2019 corresponding to PCT International Application No. PCT/EP2019/061917 filed May 9, 2019.

\* cited by examiner

CONTROL METHOD AND DEVICE THAT RESOLVES CLOSED LOOPS IN AUTOMATIC FAULT TREE ANALYSIS OF A MULTI-COMPONENT SYSTEM

CROSS-REFERENCE TO RELATED APPLICATIONS

This application claims priority to PCT Application No. PCT/EP2019/061917, having a filing date of May 9, 2019, which is based on EP Application No. 18176423.4, having a filing date of Jun. 7, 2018, the entire contents both of which are hereby incorporated by reference.

FIELD OF TECHNOLOGY

The following pertains to a computer-implemented method for resolving closed loops in automatic fault tree analysis of a multi-component system. The following further pertains to a device comprising a processor configured to perform such a method.

BACKGROUND

The importance of safety-critical systems in many application domains of embedded systems, such as aerospace, railway, health care, automotive and industrial automation is continuously growing. Thus, along with the growing system complexity, the need for safety assurance as well as its effort is increasing in order to guarantee the high quality demands in these application domains. The aim of safety assurance is to ensure that systems do not lead to hazardous situations which may harm people or endanger the environment. In the application domains of safety-critical systems, the safety assurance is defined by the standards, see, e.g., International Electrotechnical Commission (IEC) 61508, "Functional Safety of Electrical/Electronic/Programmable Electronic Safety-related Systems," 1998.

Traditionally, the assessment of a system in terms of safety is based on a bottom-up safety analysis approach, such as Failure Mode and Effect Analysis (FMEA), see IEC 60812, "Analysis Techniques for System Reliability—Procedure for Failure Mode and Effects Analysis (FMEA)," 1991. Alternatively, the assessment of a system according to reference implementations is based on top-down approaches such as Fault Tree Analysis (FTA), see, e.g., Vesely et al., "Fault Tree Handbook," US Nuclear Regulatory Commission, 1981. By such techniques, it is possible to identify system failure states, their causes and effects with impact on the system safety.

Often architectures of systems contain loops. An example for a loop is a closed-loop controller (PID). Closed-loop control refers to the process in which a physical variable, e. g., an ambient temperature, is to be brought to a particular value while being stabilized against disturbances. A feedback obtained based on measuring an observable indicative of the physical variable is used to set operation of an actuator influencing the physical variable. The controller is the component that acquires the actual value and derives a control signal from the difference between the set point and actual value. The controller then activates a final controlling element, e. g., a heater, that compensates for the control deviation.

Since failure propagation models often use Boolean logic, e.g., to drive a fault tree (FT), (closed) loops or ring closures are problematic. Because Boolean logic cannot contain loops in general, there are techniques to prevent loops in such models, e.g., as described in Hofig et al., "Streamlining Architectures for Integrated Safety Analysis Using Design Structure Matrices (DSMS)," Safety and Reliability: Methodology and Applications, 2014. For applications where failure propagation models are composed automatically, e.g., when the architecture is generated, such preventive technologies cannot help. Such loops often cannot be prevented, as they simply develop during the composition of a system from existing components and existing parts of failure propagation models. Therefore a technique is required that is able to deal with loops in failure propagation models that use Boolean logic.

In Yang et al., "Analytic Method to Break Logical Loops Automatically in PSA," Reliability Engineering & System Safety, 56(2):101-105, 1997, the authors automatically break open loops analytically. They use a top-down expansion of the Boolean equation until they detect a loop by addressing the same structural element in a conjunction twice. The term is then removed from the equation, arguing that a larger multiplication of basic events results in a smaller portion of the overall reliability. The result may become inexact and optimistic and the failure grows with the number of loops being detected.

In Cuenot et al., "Proposal for extension of meta-model for error failure and propagation analysis," Safe Automotive Software Architecture (SAFE), an ITEA2 project, 2013, the loops are removed from failure propagation models, but this work only addresses one-dimensional loops with only one entry and one exit point. Thus, it is not possible or only possibly to a limited degree to break open arbitrary loops that are multi-dimensional with multiple entry and exit points into other loops.

In Vaurio et al., "A Recursive Method for Breaking Complex Logic Loops in Boolean System Models," Reliability Engineering & System Safety, 92(10):1473-1475, 2007, the authors use a top-down method to expand the Boolean formula through all existing loops recursively. They stop this recursion after a step where further unrolling loops does not change the cut sets of the Boolean equation any more. It is assumed that this is a valid criterion for the termination of the algorithm, since the number of cut sets is finite. There is no proof that unrolling will not alternate between two solutions. Also, the number of cut sets grows exponential and so does the algorithm, which should be in $O(n^n)$.

Another approach can be found in Lim et al., "Systematic Treatment of Circular Logics in a Fault Tree Analysis," Nuclear Engineering and Design, 245 (Supplement C):172-179, 2012, where the initial condition of a system is investigated to treat circular logic. An initial condition of a circular logic is the point where the loop is closed. If the next gate is of the type "fails to run" or "fails to start", the circular logic is treated differently. These conditions indicate whether a supporting system is in standby and needs to be started to fulfill its function or if a system is running and fails to perform its operation. This knowledge is required for all gates of a fault tree logic that close a loop to automatically treat the circular logic using the algorithm. This limits the ability to fully automate the process of removing circular logic from automatically generated fault trees.

SUMMARY

An aspect relates to advanced techniques of analyzing safety-critical systems. In particular, a need exists for advanced techniques of identifying and resolving loops in fault trees.

According to an aspect of embodiments of the invention, a computer-implemented method for resolving closed loops in automatic fault tree analysis of a multi-component system is provided. The method comprises modeling the multi-component system using a fault tree, the fault tree comprising elements associated with components of the multi-component system and interconnections between the elements associated with functional dependencies between the components; back-tracing failure propagation paths from an output element of the fault tree via the interconnections towards one or more input elements of the fault tree; checking, for all failure propagation paths, if the respective failure propagation path contains a closed loop by identifying a downstream element of the respective failure propagation path having a dependency of its output value on an output value of an upstream element of the failure propagation path; setting the input value corresponding to a loop interconnection of each such downstream element to Boolean TRUE; replacing any Boolean AND-gate having, independently of the specific values of the input elements, Boolean TRUE as output value with a Boolean OR-gate between the respective downstream element and the respective upstream element; cutting off any Boolean TRUE input to any Boolean AND-gate remaining between the respective downstream element and the respective upstream element; and setting the input value of each respective downstream element corresponding to the loop interconnection to Boolean FALSE.

According to another aspect of embodiments of the invention, a device is provided. The device comprises a processor configured to perform a method according to embodiments of the invention.

One idea of embodiments of the present invention is to provide a method of resolving closed loops by following an approach inspired by fixed-point iteration, i.e. by a method of computing solutions of equations that can be written in the form $x=f(x)$. Given such a function defined on real numbers with real values and given a starting point xo in the domain off, one can show that the sequence $x_{n+1}=f(x_n)$, $n=0, 1, 2 \ldots$ converges against a solution x of $x=f(x)$ under specific circumstances. In the present case, taking into account the underlying Boolean logic, only two values are possible for variables, namely Boolean TRUE and FALSE. A fault tree or failure propagation paths within the fault tree may be regarded as some form of equation or system of coupled equations. Embodiments of the present invention now consider Boolean TRUE as starting value to all failure propagation paths where a closed loop has been discovered, such closed loops being found by iteratively going through the fault tree from the output to one or more inputs. Based on that, certain properties of the fault tree are evaluated and the fault tree is amended in a specific way to remove any closed loop present in the fault tree. Subsequently, Boolean FALSE is inserted as second starting value to render the remaining fault tree analyzable.

The specifics of the method according to embodiments of the invention will become more apparent further below with reference to exemplary embodiments depicted in the drawings as appended. In short, simple fault trees may already be solved by simply setting any loop interconnection to Boolean TRUE. In case a tautology arises, which means that the output element of the fault tree gives Boolean TRUE independent of the values of the input elements, the loop interconnections have to be set to Boolean FALSE in a subsequent step, which then may render the fault tree analyzable, that is without any remaining loops. However, for specific complex fault trees, problems may arise, which make it necessary to remove any pseudo Boolean AND-gate in the fault tree, which is any Boolean AND-gate that has Boolean TRUE as output value independent of the specific values of the input elements (i.e. a Boolean AND-gate that represent a tautology). Moreover, the Boolean AND-gates remaining after this removal of tautological Boolean AND-gates may still have problematic inputs, namely inputs that have Boolean TRUE as input value independent of the specific values of the input elements. These inputs are cut. Setting any loop interconnection to Boolean FALSE in the next step then renders any fault tree analyzable, which means that the remaining fault tree does not contain loops anymore and hence may be expressed as and/or expanded into a definite Boolean expression.

The solution according to embodiments of the invention is highly effective compared to conventional methods. The method of embodiments of the invention features linear complexity O(n) and thus is much faster than any method known so far. The method may enable automatized optimization of technical products and/or systems with regards to reliability, availability, maintainability and/or safety (RAMS requirements). Moreover, such RAMS requirements may be taken into consideration for the optimization of further technical system properties like for example efficiency and so on. Embodiments of the invention provides an advanced technique for analyzing safety-critical systems.

According to an embodiment of the method, the fault tree may be expressed within Boolean algebra by iteratively expanding the fault tree into Boolean expressions at the elements, for example by proceeding from the output element via the interconnections towards the input elements.

According to an embodiment of the method, the closed loop of the fault tree may be associated with a closed-loop control circuitry of the multi-component system.

Embodiments of the invention will be explained in greater detail with reference to exemplary embodiments depicted in the drawings as appended.

BRIEF DESCRIPTION

Some of the embodiments will be described in detail, with references to the following Figures, wherein like designations denote like members, wherein.

DETAILED DESCRIPTION

Although specific embodiments are illustrated and described herein, it will be appreciated by those of ordinary skill in the art that a variety of alternate and/or equivalent implementations may be substituted for the specific embodiments shown and described without departing from the scope of the present invention. Generally, this application is intended to cover any adaptations or variations of the specific embodiments discussed herein.

Herein, techniques are described to reliably and computationally inexpensively detect closed loops and/or ring closures in fault trees (FT). For this, a plurality of failure propagation paths are back-traced from an output of the FT towards one or more inputs of the FT. Then, for each failure propagation path, a check can be made if the respective failure propagation path forms a closed loop. Then, if a closed loop is identified, it may be possible to take an appropriate counter measure to mitigate negative effects of the closed loop on the analyzability of the FT.

Generally, the techniques described herein may find application in various kinds and types of safety-critical systems. For example, the techniques described herein may find application in multi-component system, e.g. control or actuator systems. Such control or actuator systems may provide control functionality or activation functionality for certain machines. Some elements of multi-component safety-critical systems may be implemented as hardware while some components may alternatively or additionally be implemented using software. It is possible that the safety-critical systems for which the techniques are employed include an output which provides an actuator force or a control signal for actuating or controlling one or more machines. Specific examples of safety-critical systems which may benefit from the techniques described herein include, but are not limited to, electronic circuitry including active and/or passive electronic components such as transistors, coils, capacitors, resistors, etc.; drivetrains for vehicles such as trains or passenger cars or airplanes; assembly lines including conveyor belts, robots, movable parts, control sections, test sections for inspecting manufactured goods (backend testing); medical systems such as imaging systems including magnetic resonance imaging or computer tomography, particle therapy systems; power plants; etc.

As a general rule, in the various examples described herein, different kinds and types of FTs may be used. An example implementation of a FT that may be relied upon in the techniques described herein includes a component FT (CFT). For sake of simplicity, hereinafter, various examples are described in the context of CFTs while, generally, also a FT may be employed.

CFTs are described, e.g., in Kaiser et al., "A new component concept for FTs," Proceedings of the 8th Australian Workshop on Safety Critical Systems and Software, Volume 33, pp. 37-46, 2003. CFTs provide a model- and component-based methodology for FT analysis, which supports a modular and compositional safety analysis strategy. The CFT includes a plurality of elements. The elements are associated with components of the system. The CFT also includes a plurality of interconnections between the elements. The interconnections are associated with functional dependencies between components of the system. Such functional dependencies may model input/output of control signals or flow of forces. The CFT may model an error behavior of the system. The error behavior of the system may be modeled by the CFT using approaches of hierarchical decomposition. Here, the overall behavior of the system can be predicted based on the individual behavior of components. In other words, the causal chain leading to an overall system behavior may be modeled by a causal chain of errors of components. The CFT may include Boolean interconnections between adjacent elements to model propagation of errors throughout the system. The CFT may model the system using a graph; here nodes of the graph may correspond to the elements and edges of the graph may correspond to the interconnections.

Various techniques described herein are based on the finding that CFTs modeling a system using Boolean logic expressions can malfunction if they include closed loops and/or ring closures. A closed loop may generally be present if an input value of an element of the CFT is derived from an output having an associated Boolean logic expression, which includes that input value.

Figure 1:
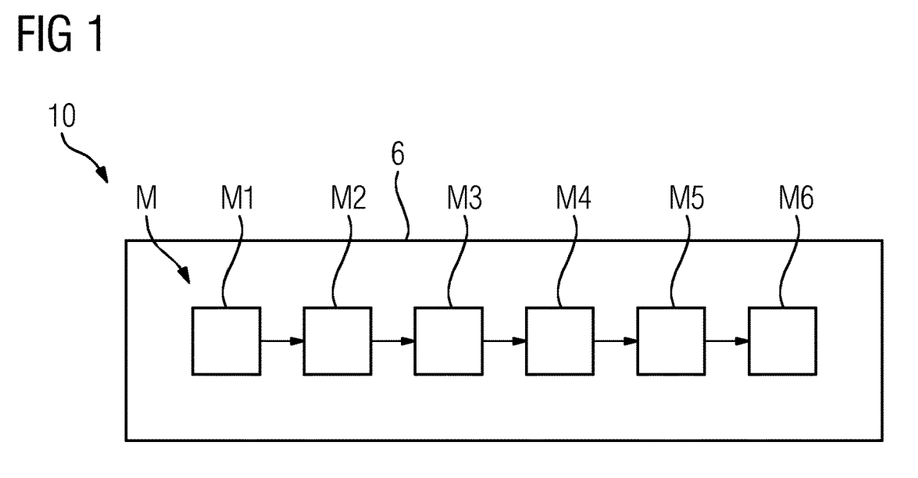
FIG. 1 shows a device with a processor performing a method according to embodiments of the invention.

FIG. 1 shows a device 10 with a processor 6 performing a method M according to embodiments of the invention for resolving closed loops in automatic fault tree analysis of a multi-component system (not depicted). The multi-component system may be, for example, a safety critical system or the like, which may comprise closed-loop control circuitry of a closed-loop controller (PID). The PID may for example be configured to control a component of the multi-component system on basis of a closed control loop. The PID may for example control a physical variable like a temperature, a pressure, a force and so on.

Figure 2:
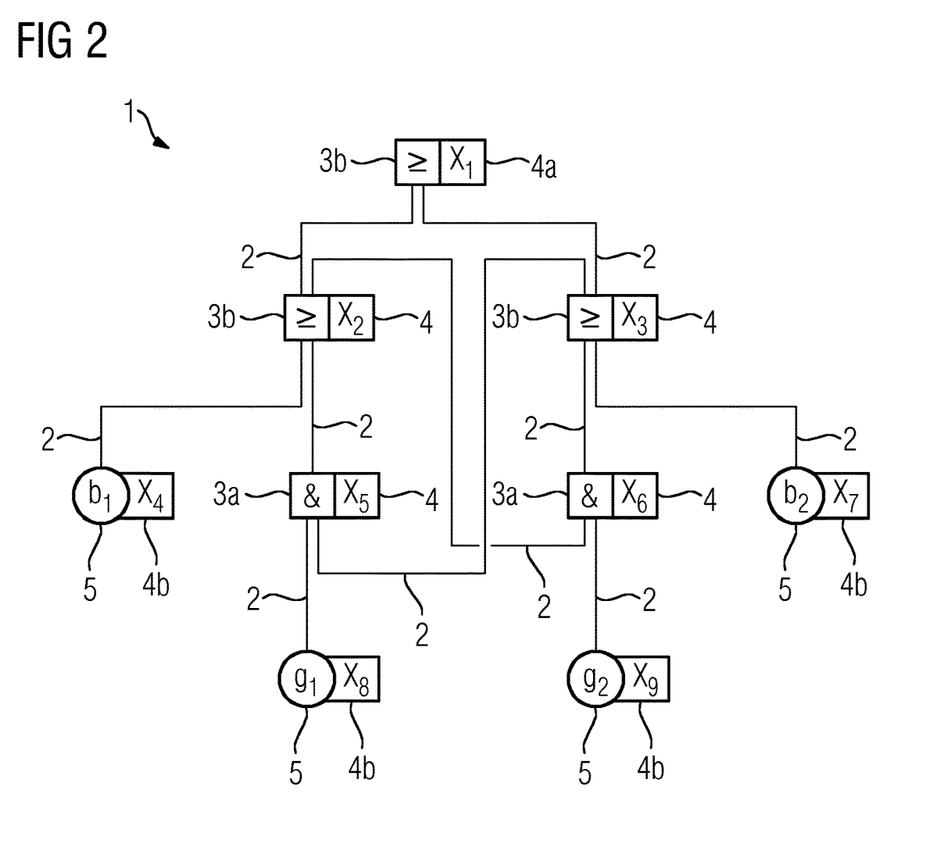
FIG. 2 shows a first fault tree analyzed with the device of FIG. 1.
Figure 3:
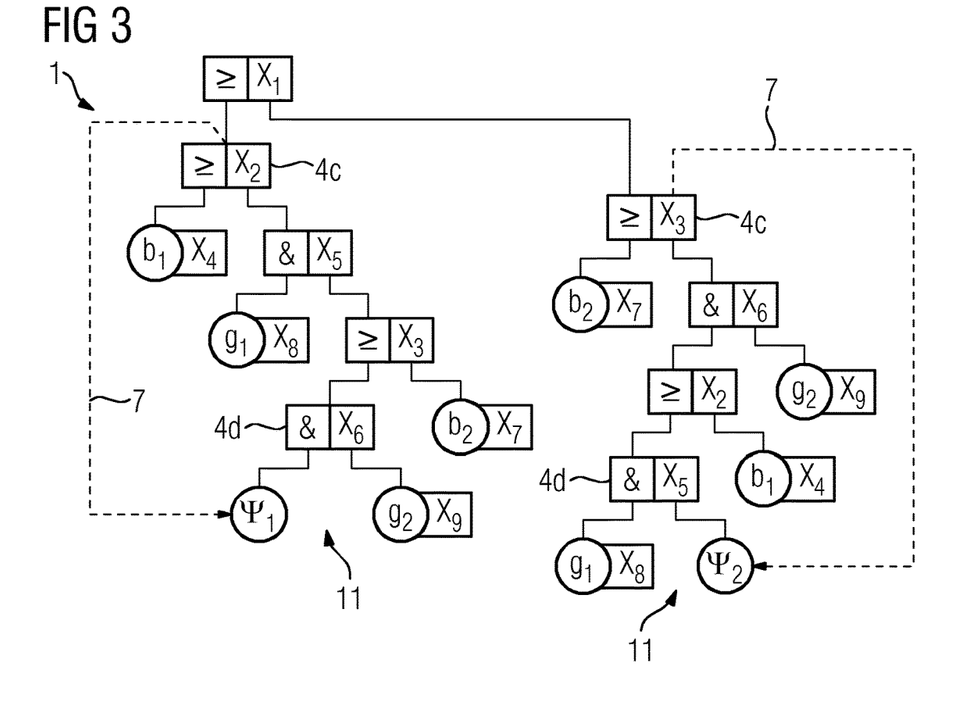
FIG. 3 shows a second fault tree analyzed with the device of FIG. 1.
Figure 4:
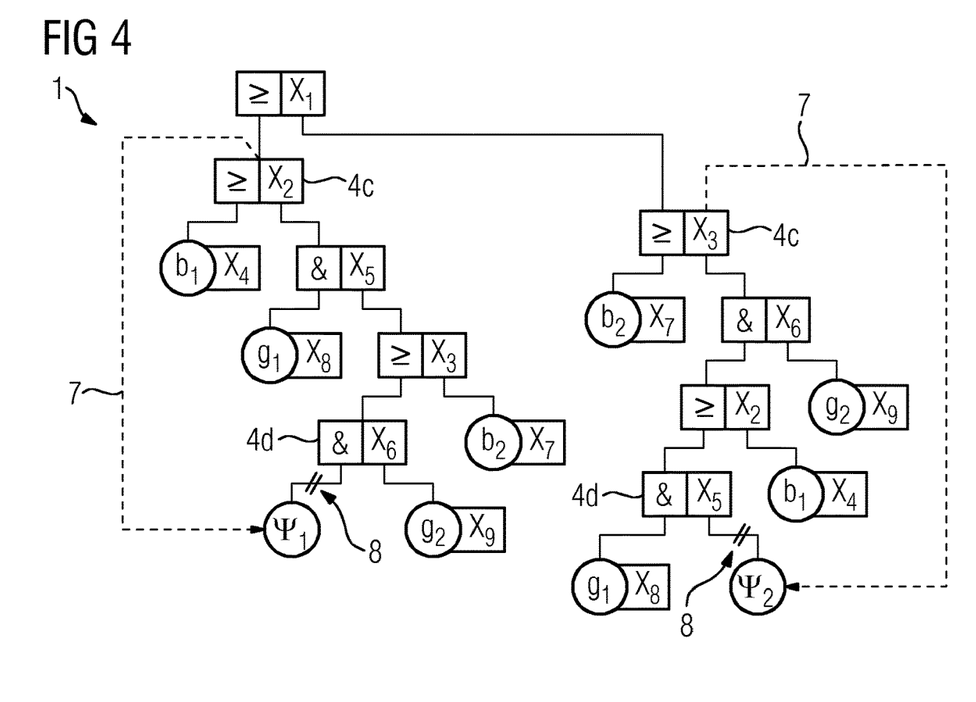
FIG. 4 shows a third fault tree analyzed with the device of FIG. 1.

The method M will be explained in detail with reference to FIGS. 2 to 4 for one particular example of a fault tree 1. The fault tree 1 models a multi-component system and comprises a plurality of elements 4 associated with components of the multi-component system and interconnections 2 between the elements 4 associated with functional dependencies between the components. Accordingly, the method M comprises under M1 modeling the multi-component system using the fault tree 1. The fault tree 1 comprises one output element 4a and four input elements 4b. Each element 4 (labeled as $X_i$ with i=1 ... 9) is associated with either a gate 3 or an event 5. In this particular example, there are three Boolean OR-gates 3b and two Boolean AND-gates 3a. Further, there are different basic events $b_1, b_2, g_1, g_2$. As can be seen in FIG. 2, the gates $X_5$ and $X_6$ both have inputs stemming from gates upstream in the fault tree, namely from $X_3$ and $X_2$, respectively. Hence, these two gates $X_5$ and $X_6$ cause loops within the fault tree 1, which make it problematic to automatically analyze the fault tree 1 as no meaningful Boolean expression can be readily assigned to the fault tree 1 due to the loop.

The method M further comprises under M2 back-tracing failure propagation paths 11 from the output element 4a of the fault tree 1 via the interconnections 2 towards the input elements 4b of the fault tree 1. This back-tracing is illustrated in FIG. 3, where it can be seen that the fault tree 1 is basically decomposed into two failure propagation paths 11, each of which features one closed loop 7. Or, to describe it differently, the fault tree 1 is "unrolled". The interconnection of each loop 7 to the respective failure propagation path 11 is labeled $\psi_i$ in the following. Hence, the failure propagation path 11 on the left in FIG. 3 has one closed loop 7 connecting one input of element $X_6$ with the output of element $X_2$ at loop interconnection $\psi_1$. Correspondingly, the failure propagation path 11 on the right in FIG. 3 has one closed loop 7 connecting one input of element $X_5$ with the output of element $X_3$ at loop interconnection $\psi_2$.

Such loop-causing gates may be identified in a general manner by checking for all failure propagation paths 11 if the respective failure propagation path 11 contains a downstream element 4d having a dependency of its output value on an output value of an upstream element 4c of the failure propagation path 11. Accordingly, the method M comprises under M3 checking, for all failure propagation paths 11, if the respective failure propagation path 11 contains a closed loop 7 by identifying a downstream element 4d of the respective failure propagation path 11 having a dependency of its output value on an output value of an upstream element 4c of the failure propagation path 11.

Next, the method M removes these two closed loops 7 in the fault tree 1. To this end, the method M comprises under M4 setting the input value corresponding to the loop interconnection $\psi_i$ of each such downstream element 4d to Boolean TRUE. Or, in other words, the problematic element turning up in a corresponding Boolean expression at this point is replaced by the expression $\psi_i$. Further, the method comprises under M5 replacing any Boolean AND-gate 3a having, independently of the specific values of the input elements 4b, Boolean TRUE as output with a Boolean OR-gate 3b between the respective downstream element 4d and the respective upstream element 4c. With reference to FIG. 4, it can be seen that no Boolean AND-gates 3a can be found that fulfill these criteria and, thus, no Boolean AND-gates 3a are replaced by a Boolean OR-gate 3b (however, cf. the examples in FIGS. 5 to 8 for other examples).

The method M further comprises under M5 cutting off any Boolean TRUE input to any Boolean AND-gate 3a remaining between the respective downstream element 4d and the respective upstream element 4c. As can be seen in FIG. 4, for both $X_6$ and $X_5$ one respective input is cut off, namely the loop interconnections $\psi_1$ and $\psi_2$ (denoted as cut interconnections 8 in FIG. 4). Finally, the method M comprises under M6 setting the input value of each respective downstream element 4d corresponding to the loop interconnection $\psi_i$ to Boolean FALSE. In this particular example, the loop interconnections $\psi_i$ are cut off anyway, hence this method step has no consequence (cf., however, the examples in FIGS. 5 to 8). As can be seen in FIG. 4, the closed loops 7 have been removed, i.e. they have been cut off the failure propagation paths 11. Only well-defined Boolean gates 3 and basic events $b_i$, $g_i$ remain in the fault tree 1. Hence, the fault tree 1 in FIG. 2 can now be evaluated, that is, it can be iteratively expanded into definite Boolean expressions at the elements 4, proceeding from the output element 4a via the interconnections 2 towards the input elements 4b or vice versa. The fault tree 1 thus can be expressed as:

$$(b_1 \lor (g_1 \land (g_2 \lor b_2))) \lor (b_2 \lor (g_2 \land (b_1 \lor g_1)))$$

Figure 5:
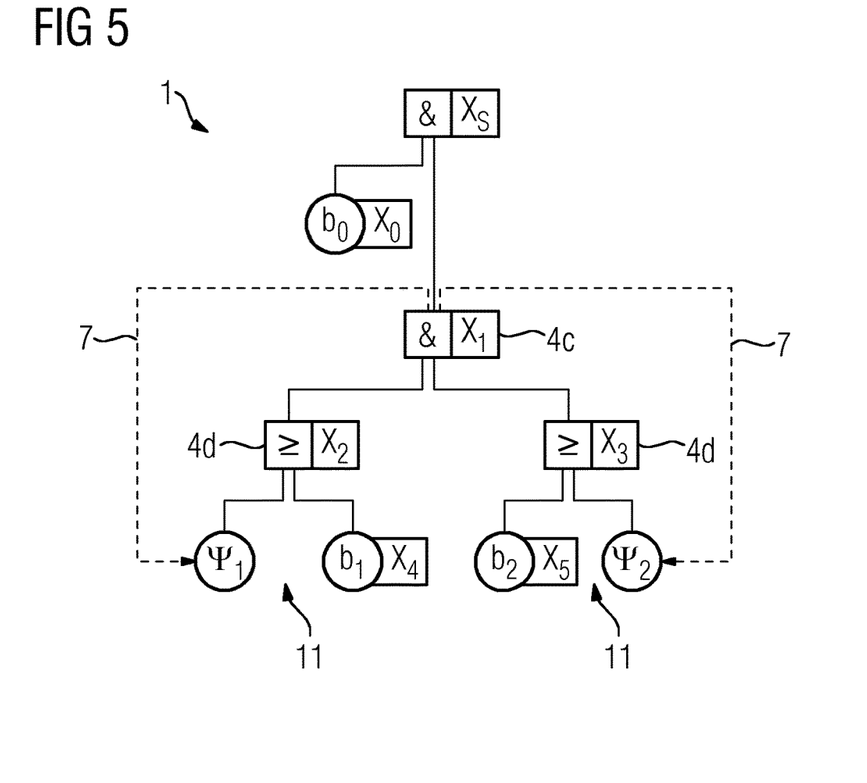
FIG. 5 shows another fault tree analyzed with the device of FIG. 1.
Figure 6:
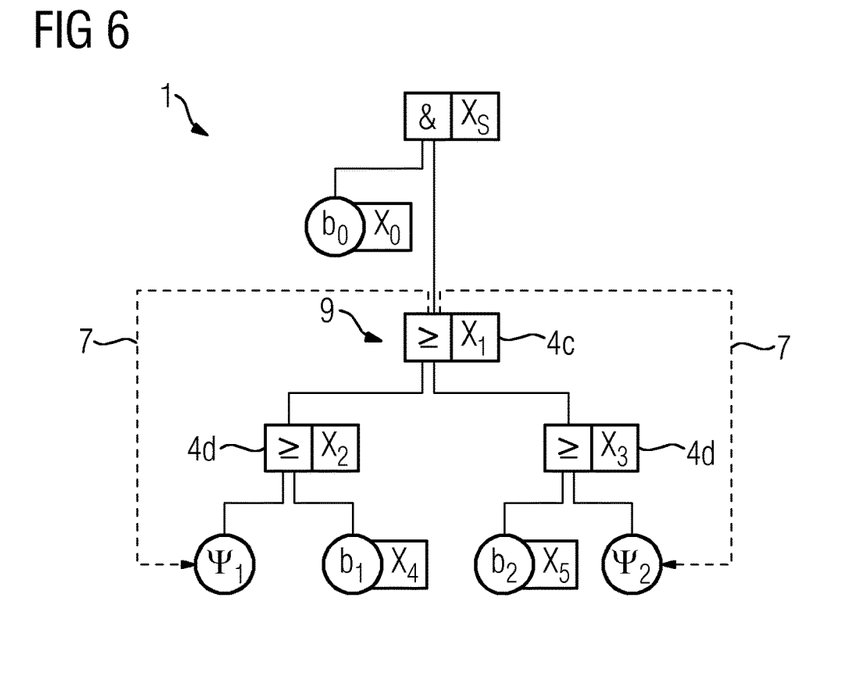
FIG. 6 shows another fault tree analyzed with the device of FIG. 1.

FIGS. 5-6 show another fault tree 1 analyzed with the device 10 of FIG. 1. Again, the fault tree 1 comprises two closed loops 7. However, contrary to the example in FIGS. 2 to 4, these two closed loops 7 are coupled to each other and cannot be separated into two distinct failure propagations paths 11 as in FIGS. 2 to 4 (notice element $X_1$, which is shared by both failure propagations paths 11 and both loops 7).

In fact, the Boolean AND-gate at element $X_1$ has Boolean TRUE as output value independently of the specific values of the input elements $X_4$ and $X_5$ when $\psi_1$ and $\psi_2$ are set to Boolean TRUE and hence is functioning as a pseudo-AND gate (this is due to the Boolean OR-gates $X_2$ and $X_3$). Hence, the method M of FIG. 1 replaces this Boolean AND-gate at element $X_1$ with a Boolean OR-gate (denoted under reference sign 9 in FIG. 6). Next, $\psi_1$ and $\psi_2$ are set to Boolean FALSE and the fault tree 1 is iteratively expanded into the following Boolean expression:

$$X_S = (b_0 \land (b_1 \lor b_2))$$

Figure 7:
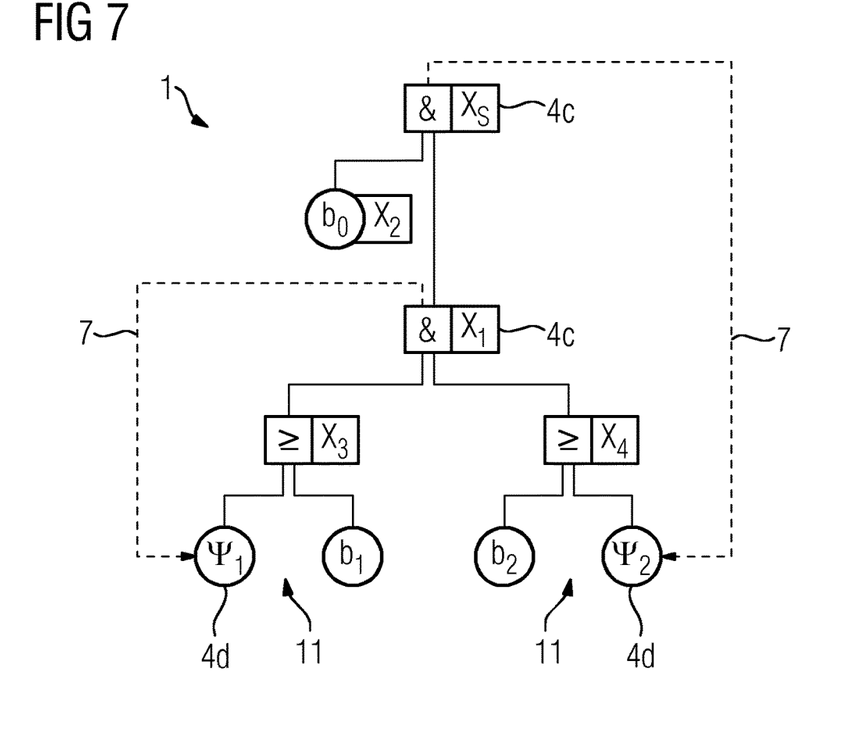
FIG. 7 shows another fault tree analyzed with the device of FIG. 1.
Figure 8:
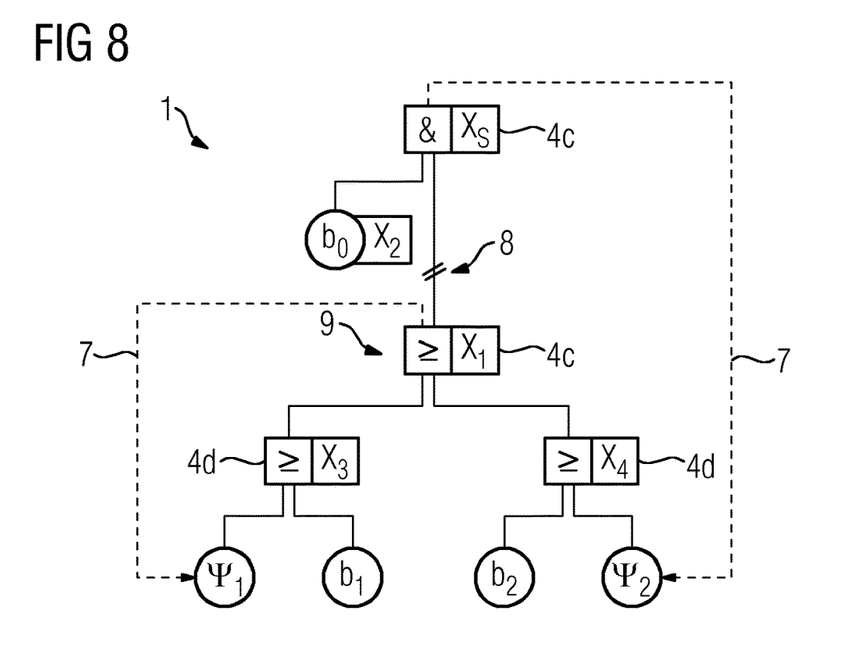
FIG. 8 shows another fault tree analyzed with the device of FIG. 1.

FIGS. 7-8 show another fault tree 1 analyzed with the device 10 of FIG. 1. Again, the fault tree 1 comprises two closed loops 7. In a similar way as the fault tree 1 in FIGS. 5-6, this fault tree 1 comprises at $X_1$ a pseudo-AND gate, which is replaced by the method M with Boolean OR-gate 9 (cf. FIG. 8). Furthermore, the remaining Boolean AND-gate $X_S$ (which is not a pseudo-AND gate and thus is not replaced with a Boolean OR-gate) has one of its input values Boolean TRUE independently of the specific values of the basic events $b_1$ and $b_2$, when $\psi_1$ and $\psi_2$ are set to Boolean TRUE. Thus, the method M cuts this input off (denoted as cut interconnection 8 in FIG. 8). Next, $\psi_1$ and $\psi_2$ are set to Boolean FALSE and the fault tree 1 can be iteratively expanded into the following Boolean expression as no closed loops 7 are present anymore:

$$X_S = (b_0)$$

Summarizing, an algorithm is described that is in O(n) able to remove arbitrary circular logics from fault trees. With this algorithm, automatically generated architectures can easily be analyzed for safe function without any other additional information than ordinary FT information. The here presented algorithm provides thereby a fundamental enabling technology for digitalized design processes of safety critical systems.

In the foregoing detailed description, various features are grouped together in one or more examples or examples with the purpose of streamlining the disclosure. It is to be understood that the above description is intended to be illustrative, and not restrictive. It is intended to cover all alternatives, modifications and equivalents. Many other examples will be apparent to one skilled in the art upon reviewing the above specification.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A computer-implemented method performed by a processor, comprising:
    analyzing a multi-component safety-critical system comprising closed-loop circuitry of a closed-loop controller using a fault tree to identify a system failure, a cause of the system failure, and an impact to safety as a result of the system failure, wherein, prior to the analyzing, arbitrary circular logics of the fault free are removed from the fault tree by:
        modeling the multi-component system using a fault tree, the fault tree comprising elements associated with components of the multi-component system and interconnections between the elements associated with functional dependencies between the components;
        back-tracing failure propagation paths from an output element of the fault tree via the interconnections towards one or more input elements of the fault tree;
        checking, for all failure propagation paths, if the respective failure propagation path contains a closed loop associated with the closed-loop circuitry of the closed-loop controller to control a component of the multi-component safety critical system by identifying a downstream element of the respective failure propagation path having a dependency of its output value on an output value of an upstream element of the failure propagation path;

setting the input value corresponding to a loop interconnection of each such downstream element to Boolean TRUE;

replacing any Boolean AND-gate having, independently of the specific values of the input elements, Boolean TRUE as output value with a Boolean OR-gate between the respective downstream element and the respective upstream element;

cutting off any Boolean TRUE input to any Boolean AND-gate remaining between the respective downstream element and the respective upstream element; and setting the input value of each respective downstream element corresponding to the loop interconnection to Boolean FALSE;

automatically optimizing the multi-component safety-critical system with regards to at least one of reliability, availability, maintainability, and safety, as a function of the analyzing; and in response to the automatically optimizing, controlling a component of the multi-component safety critical system with the closed-loop controller by outputting a control signal to the component.

2. The method according to claim 1, wherein the fault tree is expressed within Boolean algebra by iteratively expanding the fault tree into Boolean expressions at the elements.

3. A device comprising a processor configured to perform the computer-implemented method according to claim 1.

* * * * *